United States Patent
Rao

(10) Patent No.: US 7,139,213 B2
(45) Date of Patent: Nov. 21, 2006

(54) MULTIPLE DATA PATH MEMORIES AND SYSTEMS

(75) Inventor: G. R. Mohan Rao, McKinney, TX (US)

(73) Assignee: Silicon Aquarius, Inc., Richardson, TX (US)

(*) Notice: Subject to any disclaimer, the term of this patent is extended or adjusted under 35 U.S.C. 154(b) by 0 days.

(21) Appl. No.: 10/844,002

(22) Filed: May 12, 2004

(65) Prior Publication Data
US 2004/0240301 A1 Dec. 2, 2004

Related U.S. Application Data

(60) Provisional application No. 60/475,018, filed on Jun. 2, 2003.

(51) Int. Cl.
*G11C 8/00* (2006.01)

(52) U.S. Cl. .............. 365/230.05; 365/230.03; 365/230.06

(58) Field of Classification Search ............ 365/156, 365/154, 230.01, 230.03, 230.05, 230.06, 365/189.01, 189.04
See application file for complete search history.

(56) References Cited

U.S. PATENT DOCUMENTS

| | | | |
|---|---|---|---|
| 4,811,007 A * | 3/1989 | Schreiber | 345/545 |
| 5,426,603 A * | 6/1995 | Nakamura et al. | 365/149 |
| 5,835,932 A | 11/1998 | Rao | |
| 5,856,940 A | 1/1999 | Rao | |
| 5,936,959 A | 8/1999 | Jaffe | |
| 6,011,744 A * | 1/2000 | Sample et al. | 365/230.03 |
| 6,128,278 A | 10/2000 | Jaffe | |
| 6,272,577 B1 * | 8/2001 | Leung et al. | 710/110 |
| 6,317,367 B1 * | 11/2001 | Sample et al. | 365/189.08 |
| 6,396,764 B1 | 5/2002 | Holland | |
| 6,400,635 B1 * | 6/2002 | Ngai et al. | 365/230.05 |
| 6,470,415 B1 | 10/2002 | Starr et al. | |
| 6,556,502 B1 * | 4/2003 | Ngai et al. | 365/230.05 |
| 6,650,573 B1 * | 11/2003 | Sunaga et al. | 365/189.05 |
| 6,681,302 B1 | 1/2004 | Cho et al. | |
| 6,704,794 B1 | 3/2004 | Kejriwal et al. | |
| 6,717,847 B1 | 4/2004 | Chen | |
| 6,717,857 B1 | 4/2004 | Byeon et al. | |
| 6,725,347 B1 | 4/2004 | Yang et al. | |
| 6,728,909 B1 | 4/2004 | Bunton et al. | |

OTHER PUBLICATIONS

Micron Technology, Inc.; 288Mb SIO Reduced Latency (RLDRAM II); Advance Data Sheet, MT49H16M18C_3 Rev. 3, May 2003.
Infineon Technologies; HYB18RL25616/32AC 256 Mbit DDR Reduced Latency DRAM, Data Sheet Version 1.60; Jun. 30,2002; Munchen, Germany.

(Continued)

*Primary Examiner*—Gene N. Auduong
(74) *Attorney, Agent, or Firm*—Winstead Sechrest & Minick, P.C.

(57) ABSTRACT

The invention describes and provides multiple data path memories and systems utilizing such memories. Enhanced data throughput and bandwidth, while substantially simultaneously providing improved bus utilization, are some of the benefits. In peer-to-peer connected systems, multiple bank/access block/sector/sub-array with random data throughput can also be realized. A memory including a plurality of independently accessible memory banks, a READ BUS for selectively reading to a selected on of the memory banks, and a WRITE BUS independent of the READ BUS for selectively writing to a selected one of the memory banks, is described.

13 Claims, 8 Drawing Sheets

OTHER PUBLICATIONS

Samsung Semiconductor; K9F2G16U0M, 256M×8 Bit Nand Flash memory; data sheet; 2004.

Integrated Silicon Solution, Inc.; 256K×16, 256K×18 Synchronous Pipelined Static Ram; Apr. 17, 2001.

Elpida Memory, Inc.; 1GB Unbuffered DDR2 SDRAM DIMM EBE11VD8ABFA (128M words×64 bits, 2 Ranks); Doc No. E0365E40, V4.0; Preliminary Data Sheet; http://www.elpida.com; Feb. 2004.

Burney et al.; Minding network Queues with FPGAs and Memory; http:www.eetimes.com/article/showArticle.jhtml?articleID=13811104; Feb. 5, 2004; PR Newswire, EETimes; CMP Media, LLC.

Dinkelman, Micron Technology, Inc.; Going to the Max on Bus Efficiency; http://www.commsdesign.com/showArticle.jhtml?articleID=16700780; Dec. 16, 2003; PR Newswire; CMP Media, LLC.

Chang, et al.; RLDRAMs vs. CAMs/SRAMs: Part 1; http://www.commsdesign.com/showArticle.jhtml?articleID=16501400; Jun. 3, 2003; PR Newswire; CMP Media, LLC.

Chang, et al.; RLDRAMs vs. CAMs/SRAMs: Part 2; http://www.commsdesign.com/showArticle.jhtml?articleID=16501351; Jun. 9, 2003; PR Newswire; CMP Media, LLC.

Merritt; Wintel Forces Drive Toward Ethernet Convergence in Data Center; http://www.commsdesign.com/showArticle.jhtml?articleID=19502333; May 4, 2003; PR Newswire; CMP Media LLC.

Commsdesign; BroadCom retasks SoC for Docsis v2.0 duties; http://www.commsdesign.com;showArticle.jhtml?articleID=19400258; May 3, 2004; PR Newswire; CMP Media LLC.

Newscientist.com news service; Plastic Memory Promises Cheap, Dense Storage; http://www.newscientist.com; Nov. 13, 2003.

* cited by examiner

Fig. 1 Infineon's DDR Reduced Latency DRAM

Fig 3. A System Diagram for Payload (Packet Buffer Memory)

Fig. 4 Invention #1 of a new DRAM-separate Read and Write Paths*

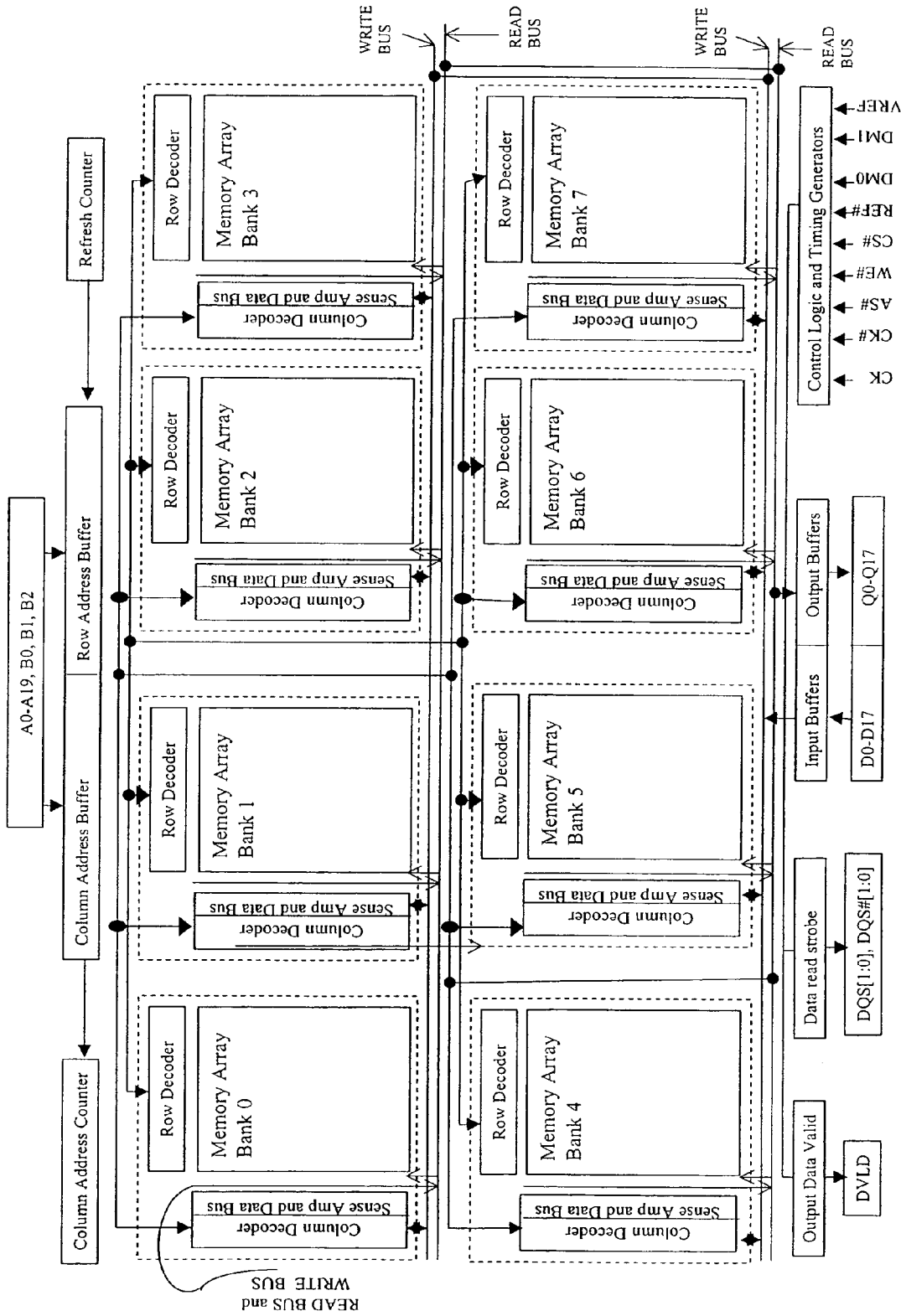
FIG. 8 288 Mbit Separate I/O RLDRAMII per the invention

MULTIPLE DATA PATH MEMORIES AND SYSTEMS

CROSS-REFERENCE TO RELATED APPLICATION

The Patent Application claims priority to provisional patent Application No. 60/475,018, "Multiple Data Path memories" filed Jun. 2, 2003 by inventor G. R. Mohan Rao.

BACKGROUND OF THE INVENTION

1. Field of Invention

The present invention relates in general to semiconductor memories. Those memories can be standalone, embedded, or stacked as multiple chips (homogeneous and heterogeneous—namely, in a memory stack, all of them can be of one kind; or, they can be different in function, utility, form factor as well as to technology).

2. Background of Invention

Semiconductor memories include dynamic random access memories (DRAM's) static random access memories (SRAM's), flash, ferroelectric, magnetic, plastic, MIM (metal-insulator-metal) RAMs, calcogenide and plastic memories, and others. The prevalent monolithic and embedded memory architecture, is multi-bank. The input/output data architecture includes double data rate (DDR), quad data rate (QDR) zero bus turnaround (ZBT SRAM's) and others. Memory storage cell architecture in nonvolatile memories, specifically flash, could be NOR or NAND (others are possible as well). As an example a conceptual block diagram of a commercially available Infineon RLDRAM (reduced latency DRAM) is shown in FIG. 1.

With the advent of diverse applications for both volatile and nonvolatile memories, a need has arisen to further enhance bandwidth and bus utilization. In peer-to peer system, as well as bus oriented systems, a need has arisen to access multiple banks/simultaneously blocks/sectors/sub-arrays, for maximum data throughput. Spin-wheel SDRAM implementations are another example of systems to address these needs. One specific application where data moves in packets (both fixed length and variable length packets) is, in communications. ATM, IP, SONET, Ethernet are some of the protocols used in communicating the information as digital data. The memory buffers used in such communications have to be flexible enough in configurability to accommodate varying length packets, with maximum efficiency (and not waste memory space). Because of the criticality of packet transmission and reception in a predetermined QOS (quality of service) deadline, each packet must be distributed across multiple banks in multiple IC's, in both INGRESS (WRITE) and EGRESS (READ) of those packets. Multiple data path memories can handle these time critical decisions without 'loss of packets,' which is not possible with current memory, architectures.

SUMMARY OF INVENTION

The invention provides a memory including a plurality of independently accessible memory banks (or blocks, or sectors, or sub-arrays as they are called in the semiconductor industry to denote memory arrays) organized as rows x columns), a read bus for selectively reading to selected one of the memory banks (or blocks, or sectors, or sub-arrays), and a write bus independent of the read bus for selectively writing to a selected one of the memory banks (or block, or sectors, or sub-arrays). The word bank "bank" is used here synonymously with block, sector, sub-array etc.

Among the numerous advantages of the various embodiments of the principles of the present invention, is to independently read and write to the banks in a multiple bank memory system. One embodiment utilizes independent read and write buses to accomplish this task. For example, while a read is being performed to one bank in the system (or IC) using the read bus, a write to another bank in the same (or different) system (or IC) can be independently and concurrently taking place using the write bus. In another embodiment, specifically where the 'read' and 'write' bus have to be 'reset' prior to the next clock ('reset' is a term that is used synonymously with 'precharge' or 'set for next operation' or 'next active command on that line'), one of the read and write buses can be pre-charged while the other is used to access data in an (active) addressed memory bank. In further embodiments, the independent read and write buses are associated with independent read and write data ports in the input/output space supporting independent data exchanges with other external components.

BRIEF DESCRIPTION OF DRAWINGS

For a more complete understanding of the present invention, and the advantages thereof, reference is now made to the following description in conjunction with the accompanying figures:

FIG. 8 is a block diagram of a 288 Mbit separate I/O RLDRAM II according to the principles of the present invention (the memory array/core can be DRAM, SRAM, flash, ferroelectric, magnetic, etc.).

DETAILED DESCRIPTION OF THE INVENTION

Figure 1:
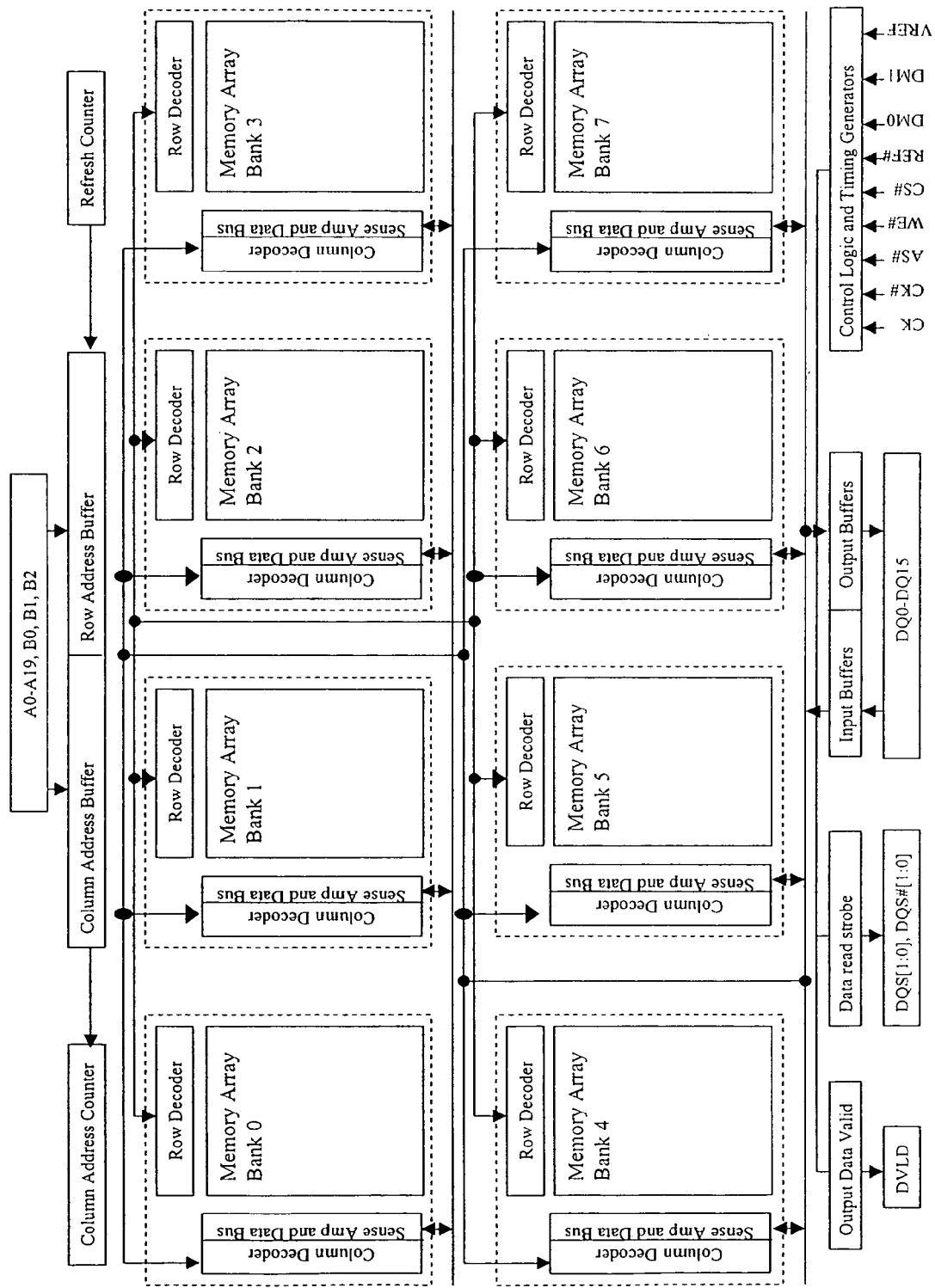
FIG. 1 is a block diagram of an exemplary Infineon's DDR reduced latency DRAM (HYB18RL 25632AC/AYB18RL25616AC).
Figure 2:
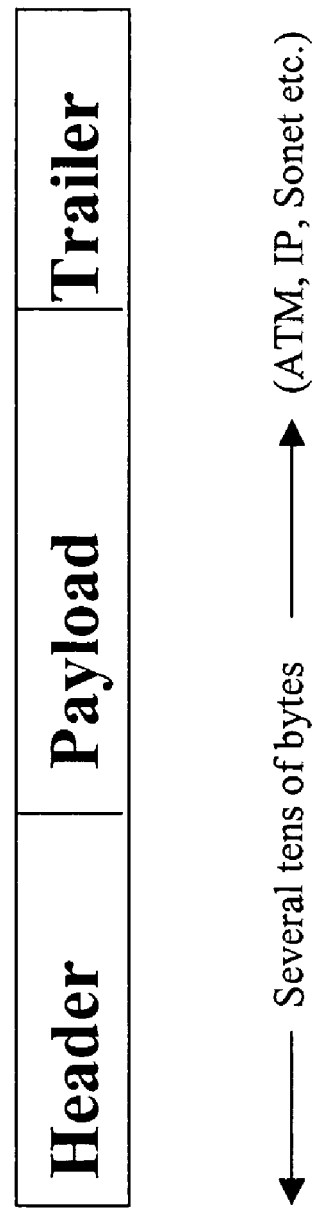
FIG. 2 is a conceptual diagram of a typical packet used in ATM, IP, SONET and similar protocols using packet data exchanges.
Figure 3:
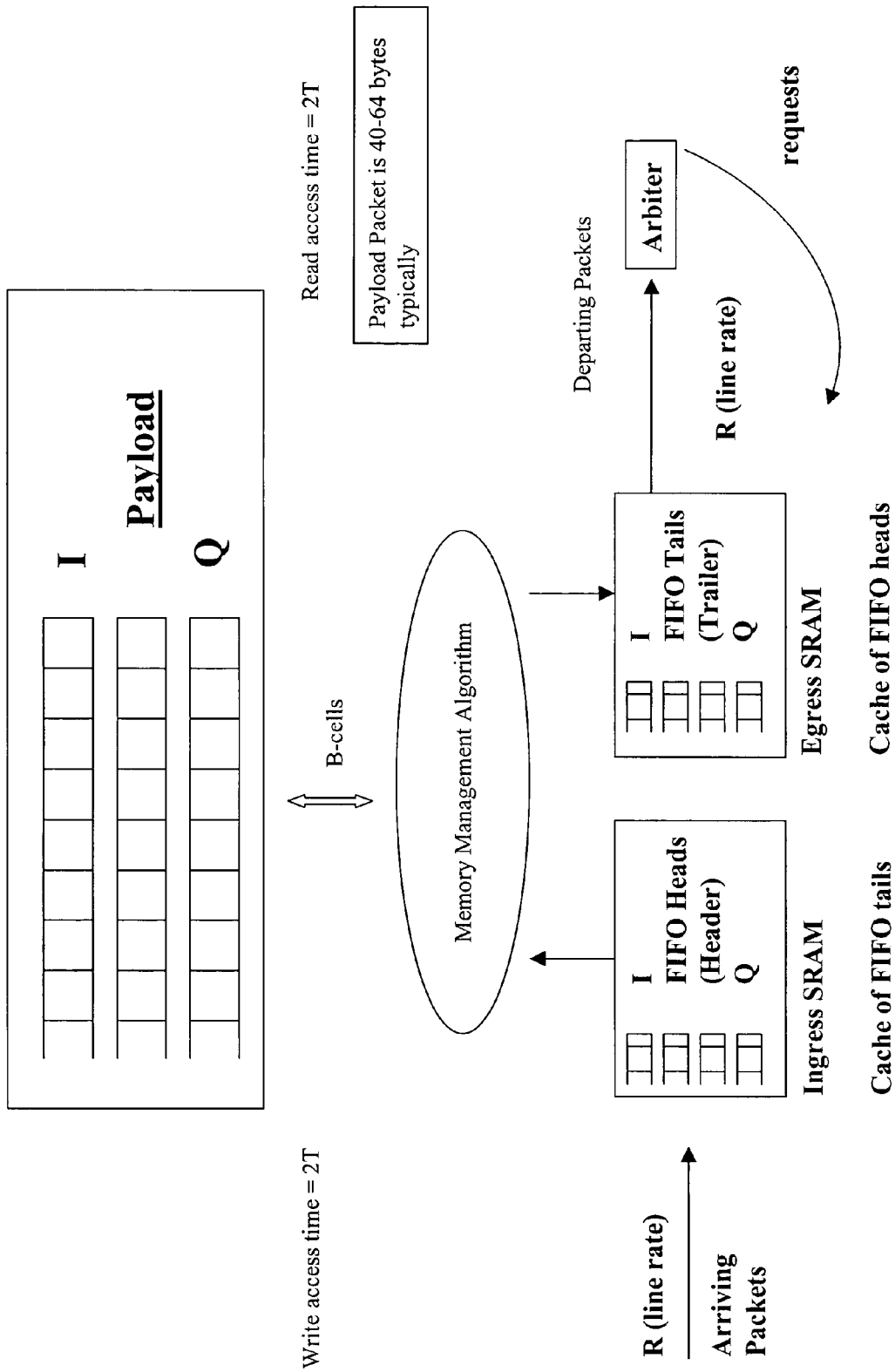
FIG. 3 is a conceptual system diagram for a payload (packet buffer) memory.

The principles of the present invention and their advantages are best understood by referring to the illustrated embodiments depicted through FIGS. 1–8 of the drawings, in which like numbers designate like parts. FIGS. 2 and 3 describe the basic operation of a communication packet buffer memory as it is utilized today in communication systems (base stations, routers, hubs, switch fabrics). References to prior art, are cited along with this patent.

Figure 4:
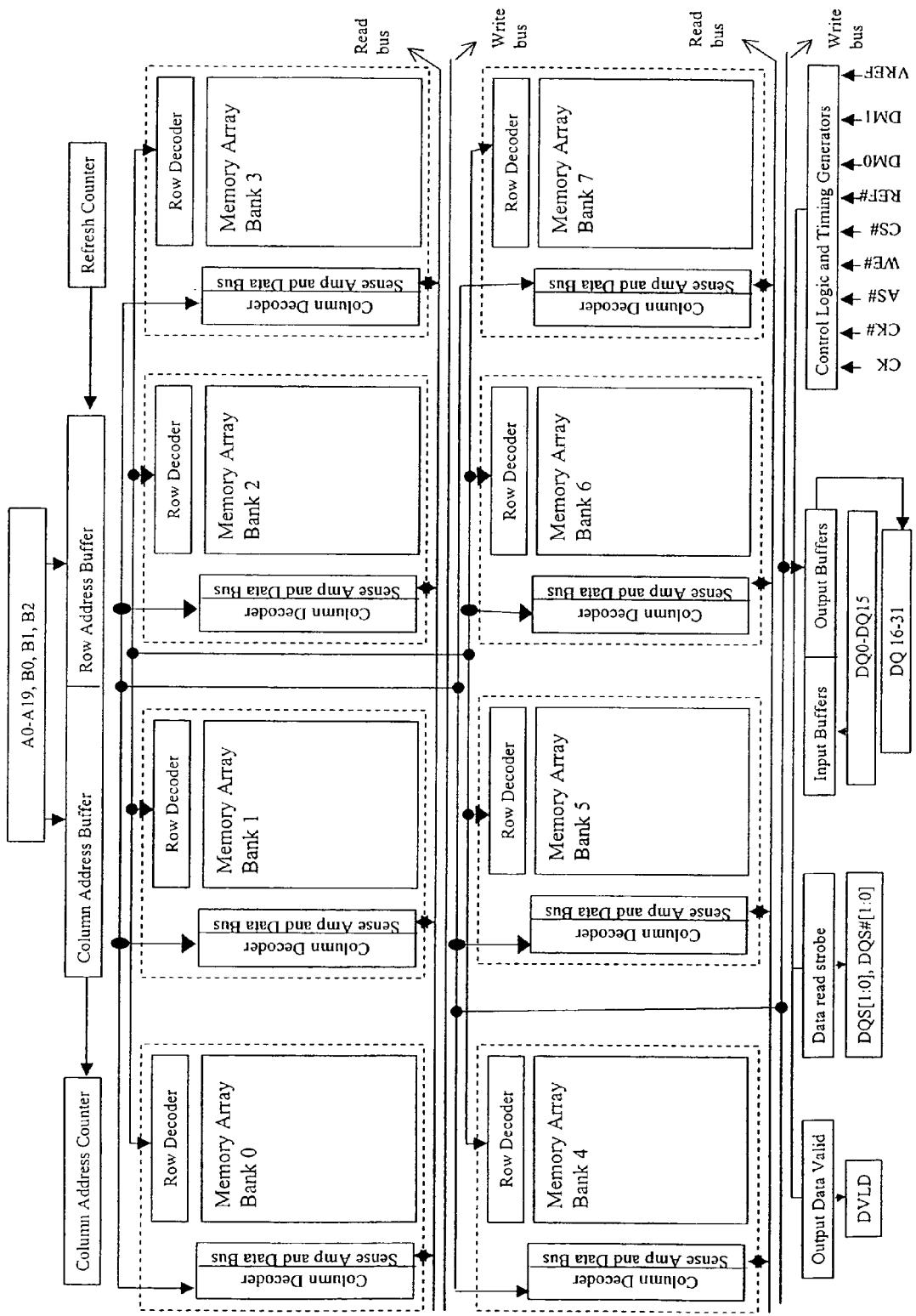
FIG. 4 is a block diagram of a new memory with separate read and write paths according to the principles of the present invention. Memory core (array) can be of any kind—DRAM, SRAM, flash, ferroelectric, magnetic, etc.

The invention described here, as illustrated in FIG. 4 has a separate READ BUS and separate WRITE BUS coupled to the sense amplifiers of each memory bank (array unit). This separation of READ and WRITE data path out of the sense amplifier significantly boosts the peak bandwidth as well as the random cycle time at the IC level itself. One method of implementing these buses to sense amplifiers has been illustrated in U.S. Pat. No. 6,396,764.

Figure 5:
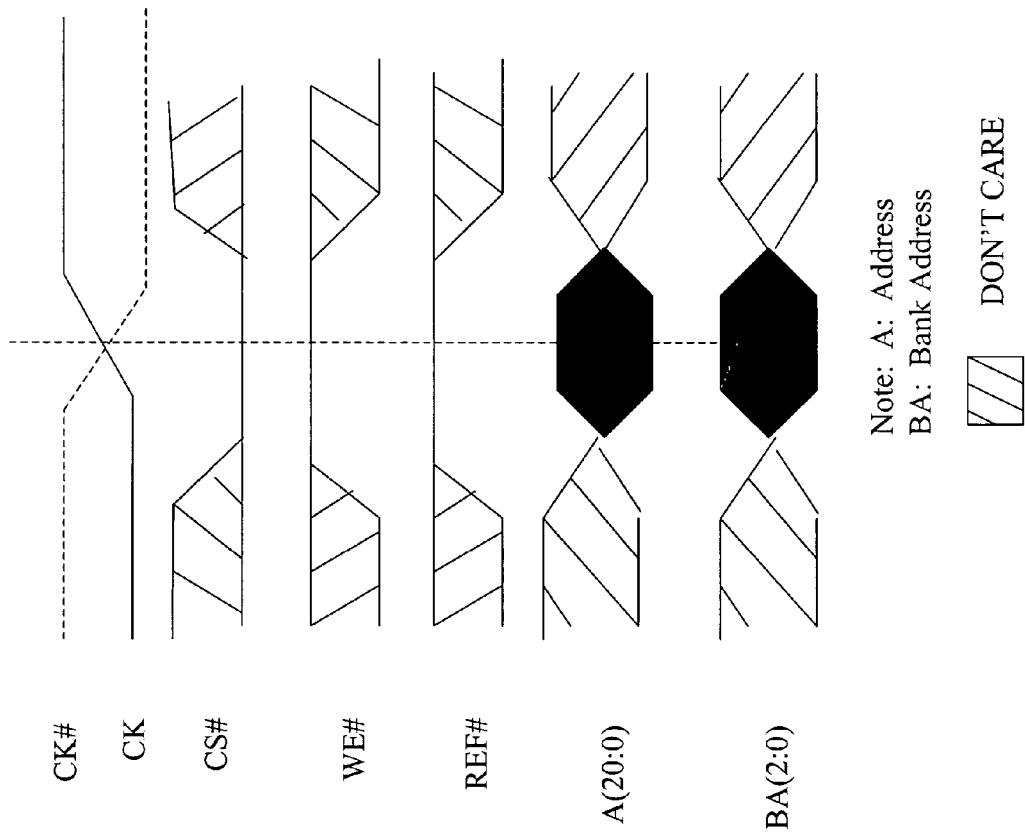
FIG. 5 is a timing diagram illustrating the timing of a Read command.
Figure 6:
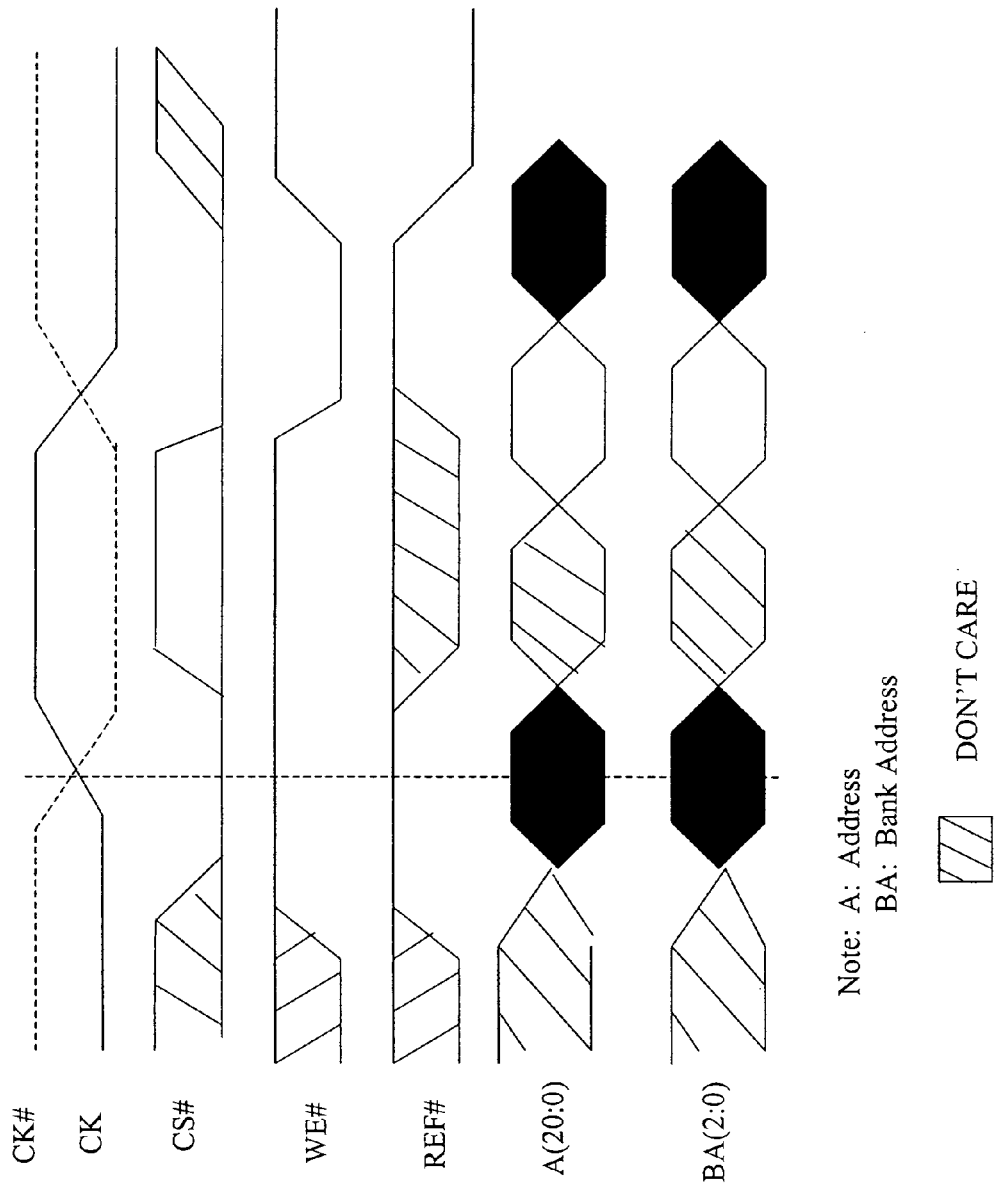
FIG. 6 is a timing diagram illustrating the timing for a READ COMMAND and/or WRITE command to two different banks.
Figure 7:
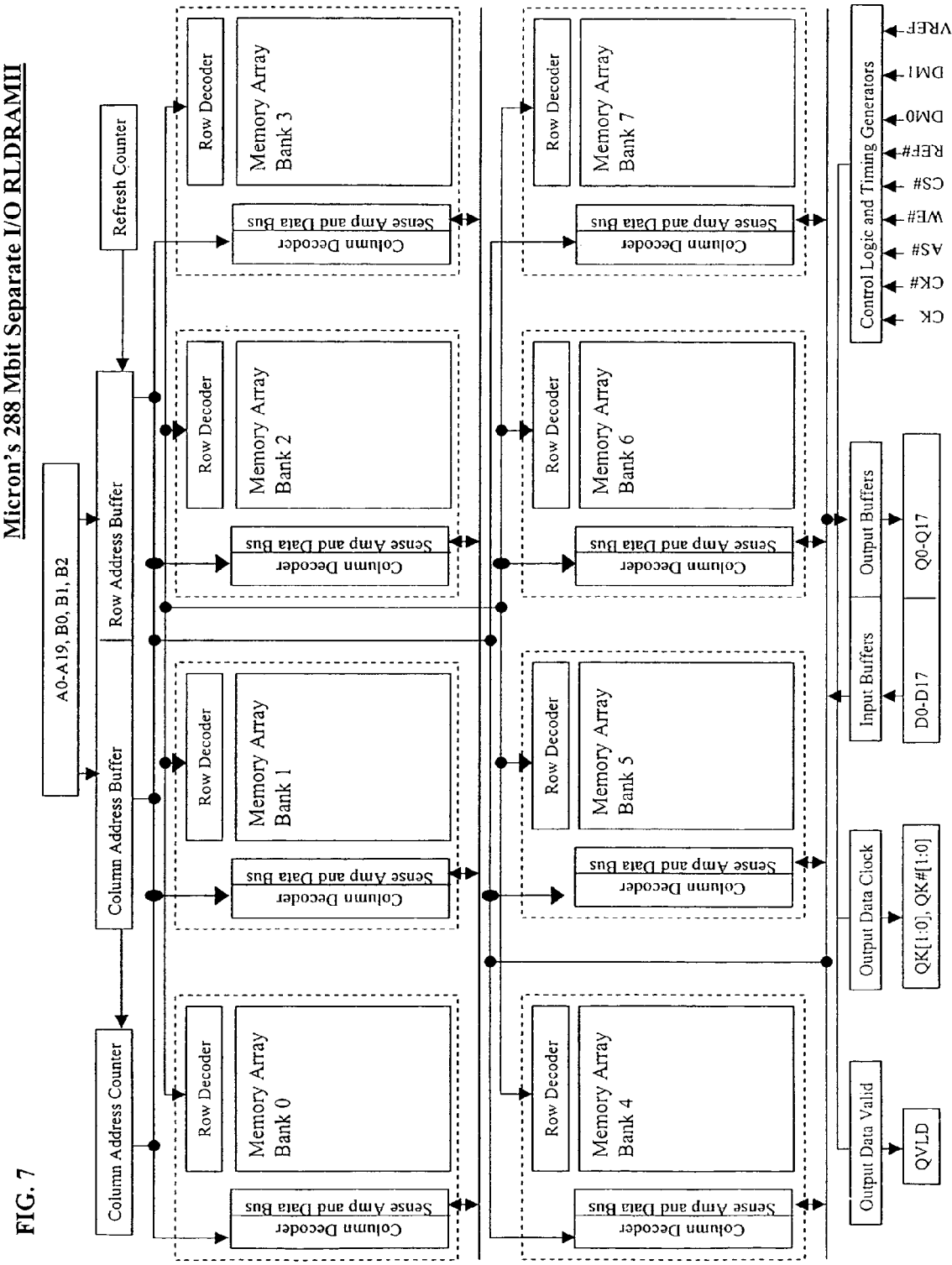
FIG. 7 is a block diagram of a Micron 288 Mbit separe I/O RLDRAM II (MT 49H 16M18C, MT49H32M9C)

FIGS. 5 and 6 are timing diagrams comparing the enhancements obtained with invention. One set of row address buffers and column address buffers is preferred; however, separate row and column address buffers for READ and Write addresses are not excluded in this invention. The former eliminates the "dead time" for bank access. In today's commercially available RLDRAMs™, (HYB18RL25632AC, MT49H8M32), have 8 banks each in monolithic 256/288 MbDRAM, FIG. 7 illustrates this as an example (Micron's RLDRAM). These 8 banks are sequentially cycled for READ or WRITE, one bank at a system, at a system clock frequency (200–400 MHZ). Typically, a bank is available only every $8^{th}$ cycle—in other words, if Bank 0 is accessed in cycle 1 (for READ or WRITE), the next access to the same Bank 0 has to wait till cycle 9 (assuming one wants access to other banks in the intermediate cycles—the most likely scenario, in systems operation). Sequentially, READING or WRITING is allowed, for data bursts, once a bank is OPEN (active)—however, such "burst" of data is in a predetermined address sequence/and hence, not random address). However, there are timing restrictions for READ and WRITE sequences to different banks within those 8 cycles. These restrictions are due to common input/output pins, data bus unavailability due to double data rate streaming in a burst mode, ability to communicate precisely on a bus with timing preambles, as they are known in data sheets and timing diagrams. Separate READ and WRITE buses remove most of the above impediments and restrictions, for maximum efficiency. Separate Input/Output data pins further enhance data bandwidth. For example, as shown in FIG. 4, with independent READ and WRITE data paths, data can be READ OUT or WRITTEN IN even with a burst mode DDR. This invention does not restrict further improvements like quad data rate (QDR). Preferably, during a burst length of 4 or greater, the 'active' (current) bank precharge can be accomplished in the background, thus improving random latency for a new row, even further. Separate I/O pins, while still maintaining common data path to the sense amplifier, as shown in Micron's RLDRAM, is still restrictive.

FIG. 8 shows another embodiment of this invention. Each bank (memory array unit) has a separate data path next to its sense amplifier. This embodiment can further enhance data throughput.

It is also obvious that the memory array (core) for data storage can be any volatile and nonvolatile memory. The inventions described here are accommodative of any of those memories.

While some particular embodiments of the invention have been shown and described, changes and modifications may be made therein without departing from the invention in its broader aspects. Therefore, the aim in the appended claims to cover all such changes and modifications as fall within the true spirit and scope of the invention.

What is claimed is:

1. A memory integrated circuit comprising:
    a plurality of independently accessible memory banks, wherein each of said plurality of independently accessible memory banks is associated with a sense amplifier, wherein said plurality of independently accessible memory banks are sequentially cycled for one of a READ and a WRITE at a system clock frequency;
    a read bus connected to each of said sense amplifiers associated with each of said plurality of independently accessible memory banks, wherein said read bus is configured to select one of said plurality of independently accessible memory banks to read;
    a write bus connected to each of said sense amplifiers associated with each of said plurality of independently accessible memory banks, wherein said write bus is configured to select one of said plurality of independently accessible memory banks to write, wherein said write bus is independent of said read bus;
    wherein the read bus and the write bus further operate to permit concurrent selective read and write functionality; and
    wherein a first bank of said plurality of independently accessible memory banks is read from and a second bank of said plurality of independently accessible memory banks is written to simultaneously.

2. A memory system as in claim 1, wherein the memory integrated circuit comprises a plurality of memory cells wherein the plurality of memory cells require periodic data refresh.

3. A memory system as in claim 1, wherein the memory integrated circuit comprises static memory cells, wherein the static memory cells do not require periodic data refresh.

4. A memory system as in claim 1, wherein the memory integrated circuit comprises a plurality of nonvolatile memory cells.

5. A memory system as in claim 1, wherein the memory integrated circuit comprises a combination of dynamic, static and nonvolatile memory cells.

6. A memory system as in claim 1, wherein the memory integrated circuit further comprises a SIP (System In Package).

7. A memory system as in claim 1, wherein the memory integrated circuit further comprises a SOC (System On Chip).

8. A memory system as in claim 1, wherein the memory integrated circuit permits operation in a shared common bus environment.

9. A memory system as in claim 1, wherein the memory integrated circuit permits operation in a peer-to-peer environment.

10. A memory system as in claim 1, wherein the memory integrated circuit further comprises rail-to-rail electric signaling.

11. A memory system as in claim 1, wherein the memory integrated circuit single ended electrical signaling.

12. A memory system as in claim 1, wherein the memory integrated circuit operates synchronously.

13. A memory system as in claim 1, wherein the memory integrated circuit operates a synchronously.

* * * * *